US008946692B2

(12) United States Patent
Kelber

(10) Patent No.: US 8,946,692 B2
(45) Date of Patent: *Feb. 3, 2015

(54) GRAPHENE (MULTILAYER) BORON NITRIDE HETEROEPITAXY FOR ELECTRONIC DEVICE APPLICATIONS

(71) Applicant: University of North Texas, Denton, TX (US)

(72) Inventor: Jeffry A Kelber, Plano, TX (US)

(73) Assignee: University of North Texas, Denton, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/678,827

(22) Filed: Nov. 16, 2012

(65) Prior Publication Data

US 2013/0302562 A1 Nov. 14, 2013

Related U.S. Application Data

(60) Continuation of application No. 13/242,878, filed on Sep. 23, 2011, now Pat. No. 8,338,825, which is a division of application No. 12/543,053, filed on Aug. 18, 2009, now Pat. No. 8,158,200.

(51) Int. Cl.
| | | |
|---|---|---|
| H01L 29/06 | (2006.01) |
| H01L 29/15 | (2006.01) |
| H01L 31/0256 | (2006.01) |
| H01L 29/08 | (2006.01) |
| H01L 35/24 | (2006.01) |
| H01L 51/00 | (2006.01) |
| B32B 9/04 | (2006.01) |
| B82Y 30/00 | (2011.01) |
| B82Y 40/00 | (2011.01) |
| C01B 31/04 | (2006.01) |
| C23C 16/26 | (2006.01) |
| C23C 16/34 | (2006.01) |
| H01L 21/02 | (2006.01) |
| H01L 21/8238 | (2006.01) |
| H01L 23/532 | (2006.01) |

(52) U.S. Cl.
CPC ............... *B32B 9/041* (2013.01); *B82Y 30/00* (2013.01); *B82Y 40/00* (2013.01); *C01B 31/0453* (2013.01); *C23C 16/26* (2013.01); *C23C 16/342* (2013.01); *H01L 21/02112* (2013.01); *H01L 21/0228* (2013.01); *H01L 21/823871* (2013.01); *H01L 23/53276* (2013.01)
USPC ...... 257/40; 257/9; 257/76; 438/99; 438/478; 427/255.394; 428/698

(58) Field of Classification Search
None
See application file for complete search history.

(56) References Cited

U.S. PATENT DOCUMENTS 5,895,938 A * 4/1999 Watanabe et al. ............... 257/77
8,158,200 B2 4/2012 Kelber
(Continued)

OTHER PUBLICATIONS

Giovannetti et al, Substrate-induced band gap in graphene on hexagonal boron nitride: Ab initio density functional calculations, Phys. Rev. B 76, 073103 (2007), 4 pages.*
(Continued)

*Primary Examiner* — Andres Munoz
(74) *Attorney, Agent, or Firm* — Steven B. Kelber

(57) ABSTRACT

Disclosed is a substrate-mediated assembly for graphene structures. According to an embodiment, long-range ordered, multilayer BN(111) films can be formed by atomic layer deposition (ALD) onto a substrate. The subject BN(111) films can then be used to order carbon atoms into a graphene sheet during a carbon deposition process.

9 Claims, 1 Drawing Sheet

(56) References Cited

U.S. PATENT DOCUMENTS

| | | |
|---|---|---|
| 8,338,825 B2 | 12/2012 | Kelber |
| 2007/0187694 A1* | 8/2007 | Pfeiffer .......................... 257/76 |
| 2009/0294759 A1* | 12/2009 | Woo et al. ....................... 257/29 |

OTHER PUBLICATIONS

Ferguson, J.D., et al., "Atomic Layer Deposition of boron nitride using sequential exposures of BCl3 and NH3." Thin Solid Films 413 (2002) 16-25.*

M. Hubacek, "Synthesis of Boron Nitride from Oxide Precursors," available on internet website URL http://hubacek.jp/bn/bn.htm on or before Feb. 9, 2006.*

Britnell, et al., "Field-Effect Tunneling Transistor Based on Vertical Graphene Heterostructures," Science, vol. 335, Feb. 24, 2012.

Kelber, et al., "Multilayer h-BN (0001) on CoSi2(111)/Si(111) by Atomic Layer Deposition: Towards Graphene-based Transistors without Band Gaps," Abstract: 2012 AMC/Albany, N.Y.

Mehr, et al., "Vertical Graphene Base Transistor", IEEE Electron Dev Lett, vol. 33, No. 5, D01: 10.1109/LED.2012.2189193.

* cited by examiner

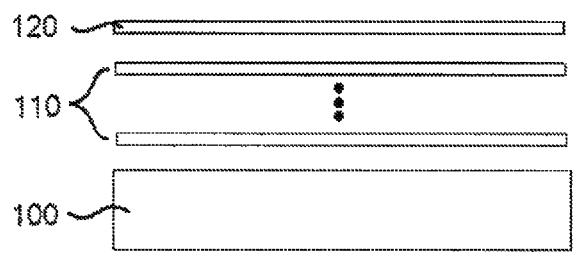

GRAPHENE (MULTILAYER) BORON NITRIDE HETEROEPITAXY FOR ELECTRONIC DEVICE APPLICATIONS

CROSS REFERENCE TO RELATED APPLICATION

This application is a continuation of application Ser. No. 13/242,878 filed Sep. 23, 2011, now U.S. Pat. No. 8,338,825, which is a divisional application of U.S. patent application Ser. No. 12/543,053, filed on Aug. 18, 2009, now U.S. Pat. No. 8,158,200, which is incorporated by reference in its entirety.

The subject invention was made, in part, with government support from the Office of Naval Research contract No, N00014-08-1-1107 through a subcontract from the Texas State University at San Marcos. The government has certain rights in the invention.

BACKGROUND OF THE INVENTION

Graphene is a single atomic layer of graphite, and currently holds interest for many electronic and spintronic device applications due to graphene's electronic properties, including high mobility, high saturation velocity, stable crystal structure, and ultrathin layer thickness. To be utilized in electronic and spintronic device applications, graphene must rest on an electronically semiconducting or insulating substrate.

Current methods of producing graphene involve either growing graphene on a transition metal substrate and then transferring a single graphene sheet onto an insulating substrate, or growing graphene by thermal evaporation of silicon from bulk SiC(0001) substrates.

In the first method, the graphene growth on the transition metal substrate is typically performed by thermal decomposition of a hydrocarbon precursor, or by formation of highly oriented pyrolitic graphite (a commercial substance), followed by chemical or manual exfoliation of a single graphene sheet and manual placement on an insulating substrate, such as $SiO_2$. These methods tend to be unpractical for large-scale production of electronic devices with consistent electronic properties, including graphene-substrate contact characteristics.

In the second method, the graphene remains on the semiconducting SiC substrate after the thermal of evaporation of the silicon from the SiC substrate. The transfer of graphene sheets grown by this second method is not practical. In addition, the growth process occurs at temperatures greater than 1500 K and does not allow for growth or integration with any device materials other than SiC—a material with numerous processing problems for device manufacture.

Recently, boron nitride (BN) has become of interest for its insulating characteristics and potential for use in nanotechnology. Hexagonal phase BN films may be grown by atomic layer deposition using layer-by-layer deposition of precursors to give a film thickness controllable to atomic dimensions. Ordered hexagonal (BN111) films 1 atomic layer thick have been grown on Ni(111), Cu(111) and Rh(111) or Ru(0001) surfaces by thermal decomposition of borazinc. However, growth of multilayer films by current methods is inhibited because the first BN monolayer renders the surface chemically inert. Moreover, the chemical structure of monolayer films grown by borazine decomposition on certain substrates such as Ru(0001) and Rh(111) is highly puckered—a "nanomesh"—and may be unsuitable for subsequent growth of ordered films. In addition, although certain monolayer (BN111) and graphene/monolayer (BN111) films have been grown, the electronic properties of these graphene films are greatly affected by electronic interaction through the single atomic layer of the graphene to the substrate. Thus, research continues to be conducted to provide useful graphene structures for device applications.

BRIEF SUMMARY OF THE INVENTION

Embodiments of the present invention provide methods for fabricating graphene structures that can be utilized for electronic device applications. Carbon atoms can be ordered into a graphene sheet during a carbon deposition process onto a substrate having multilayer BN films fabricated in accordance with certain embodiments of the present invention. The multilayer BN films can provide an electrically insulating structure between the graphene and the substrate. In addition, the multilayer BN films can serve as a topographic template to order carbon atoms into a graphene sheet during a deposition process. By using the BN films for ordering the carbon atoms into the graphene sheet, a substrate-mediated assembly is provided.

The growth of graphene sheets on BN films in accordance with embodiments of the present invention can further enable growth and patterning of graphene films on many different conductive substrates where the BN thickness can be precisely controlled to govern electron transport between the conductive substrate underneath the BN and the graphene layer.

According to one embodiment, a method of fabricating electronic devices includes graphene heteroepitaxy by substrate mediated assembly on multilayer BN(111) films with long range order.

In one aspect, (BN111) films are formed on substrates in multiple layers at controllable thicknesses greater than 1 atomic layer.

In another aspect, the subject multilayer (BN111) films are used for substrate-mediated assembly of a graphene overlayer.

In accordance with an embodiment of the present invention, large scale production of BN films and graphene structures can be achieved.

In a further embodiment, the subject methods can enable integration of graphene/BN devices with other devices.

The details of one or more embodiments are set forth in the accompanying drawings and the description below. Other features will be apparent from the description, drawings, and claims.

BRIEF DESCRIPTION OF THE DRAWINGS

FIG. 1 shows a representation of a graphene/(multilayer) BN structure in accordance with an embodiment of the present invention.

DETAILED DESCRIPTION OF THE INVENTION

Embodiments of the present invention provide a substrate-mediated assembly for graphene structures. According to an embodiment, long-range ordered, multilayer (BN111) films can be formed by atomic layer deposition (ALO) onto a substrate. Because BN films are isostructural and isoelectronic with graphene, thereby providing a chemically inert template, the (BN111) films are useful for subsequently ordering carbon atoms into a graphene sheet. In particular, the (111) in-plane lattice constant of (BN111) is 2.50 Å, which is a close lattice match to graphene (2.46 Å). Accordingly, in a further embodiment of the present invention, the subject (BN111) films can then be used to order carbon atoms into a graphene sheet during a carbon deposition process.

Current CMOS devices are approaching certain physical limits due to continual reduction in the sixes of device features, such as the gate oxide thickness and interconnect line width, the wave nature of electrons manifested on atomic dimensions, and the fundamental behavior of electrons in Si. Since graphene is a semi-metal, faster devices can be fabricated in place of or as a complement to CMOS devices. In addition, graphene devices can be implemented for charge-based, spin-based, and even qubits-based device applications.

(BN111) is an insulating material with a direct band gap of 5.97 eV. Therefore, (BN111) can be a useful insulator between the graphene and a substrate in electronic, optoelectronic and spintronic device applications. In order to produce useful graphene structures for device applications, (BN111) films with controllable thicknesses greater than one atomic layer (monolayer) are provided.

BN is an electronic insulator and when provided at thicknesses greater than one atomic layer, BN can be used to limit electron tunneling transport between a metal substrate and graphene. Such graphene/BN/metal structures can then be patterned by various methods, such as any suitable method known in the art, for multiple device applications.

According to various embodiments of the present invention, the subject multilayer (BN111) films can be grown on a substrate by atomic layer deposition (ALD) using a boron-halide or organoborane precursor, $BX_3$ (where X=chlorine Cl, bromine Br, iodine I, an alkyl group such as $CH_3$ or any combination of these) and $NH_3$. In the ALD process, the substrate is exposed alternately to each precursor, with a reaction occurring between precursors to form the desired film in a layer-by-layer manner. In this case, the relevant reaction is:

$$BX_3 + NH_3 \rightarrow BN(\text{film}) + 3HX(\text{desorbed}).$$

Multilayer films may be grown on many different substrates by alternate $BX_3/NH_3$ exposures to the substrate. According to certain embodiments the exposures can be performed at temperatures of about 550 K to about 750 K and pressure of 0.01-1000 Torr. In a specific embodiment, the pressure conditions are between 0.01 to 10 Torr. After depositing the multilayer BN film, the substrate can be annealed in vacuum or inert atmosphere to a high temperature, such as 1000 K. Typical film thickness growth rates under the above condition are ~1.3 Å per $BX_3/NH_3$ cycle.

The substrate can be selected to provide a suitable lattice structure to enable the formation of a highly crystalline film (i.e. with long range order) upon performing the annealing process. The substrate can be the (111) surfaces of transition metals. The substrate can be a bulk single crystal substrate or an ordered thin film on another substrate, where the in-plane lattice constant is between about 3.0 Å and about 2.2 Å. According to certain embodiments, suitable substrates include, but are not limited to Ru(0001), Pt(111), Pd(111), Ni(111), Nb(111) and Cu(111) single crystals, epitaxial films grown on $Al_2O_3(0001)$, ordered $Al_2O_3(111)$ films grown on suitable NiAl or $Ni_3Al$ single crystal substrates, and suitable (111) grains of Ru, Pt, Ni, Nb or Cu films grown as interconnect lines at the interconnect or packaging levels of CMOS devices. A silicon substrate may be used where a metal film having (111) surfaces is provided for forming the BN layer.

Graphene can then be formed on the (BN111) film by any suitable method to achieve a graphene/(multilayer) (BN111)/substrate structure. A uniform graphene film can be obtained by exposure of the ordered (BN111) films to carbon. The graphene can be formed by performing a carbon deposition process. For example, the carbon deposition process can include, but is not limited to chemical vapor deposition (CVD) at suitable temperatures (~1000 K) with, e.g., ethylene, benzene, methane or other volatile hydrocarbon precursors, evaporation of carbon from a graphite source, or sputter deposition of carbon from a graphite sputter target at suitable temperatures (~1000 K).

For CVD using ethylene, the relevant reaction is:

$$\frac{n}{2}H_2C = CH_2 \rightarrow C_n(\text{graphene}) + nH_2.$$

According to one embodiment, the uniform graphene films can be obtained by exposure of the ordered (BN111) films to C2H4 at pressures of about 0.01 Torr to about 1 Torr at 1000 K.

For CVD using benzene, the relevant reaction is:

$$\frac{n}{6}C_6H_6 \rightarrow C_n(\text{graphene}) + \frac{n}{2}H_2.$$

It is also contemplated within the scope of the present invention other methods for making graphene, including growth of graphene monolayers followed by manual liftoff/transfer to the substrate having the ordered multilayer BN films.

FIG. 1 shows a representation of a graphene/(multilayer) BN structure in accordance with an embodiment of the present invention. As shown in FIG. 1, a substrate 100 can be provided with multiple layers of an ordered BN film 110, and a graphene film 128 can be formed on the top layer of the BN film 110.

By fabricating the (BN111) films using ALD in accordance with certain embodiments of the present invention, long-range ordered, multilayer (BN111) films can be provided on a substrate. Furthermore, the subject long-range ordered (BN111) films are provided in thicknesses greater than one monolayer (or atomic layer).

Embodiments of the present invention can be used for a variety of electronic device applications, including electronic, optoelectronic and spintronic devices. Graphene/(BN111) structures fabricated in accordance with embodiments of the present invention can exhibit high electron mobilities and other properties indicative of a 2-dimensional electron gas. In addition, the use of (BN111) films on various metal(111) surfaces allows the growth of graphene films on insulating substrates on metal(111) films grown on sapphire. In further embodiments, the use of the subject ordered BN(111) films allows growth of graphene films on highly oriented metal films on CMOS devices.

Ordered BN and $BC_xM$ layered films fabricated in accordance with an embodiment of the present invention can exhibit direct band gaps tunable between ~2 eV-6 eV. Furthermore, the combination of ordered graphene films on ordered BN (or carbon-doped BN) films of variable thickness affords multiple potential device applications.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to utilize or combine such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A composition of matter, comprising:
an ordered film of boron nitride (BN) prepared by atomic layer deposition comprised of multiple layers and having a thickness greater than one atomic layer of hexagonal boron nitride, said ordered film of BN exhibiting at least one major surface; and
a layer of graphene formed on said major surface by chemical vapor deposition.

2. The composition of matter according to claim 1, wherein said ordered film of BN exhibits a band gap of about 2 eV-6 eV.

3. The composition of matter according to claim 1, wherein said ordered film of BN is positioned on a substrate on a side of said ordered film of BN opposite said at least one major surface.

4. The composition of matter according to claim 3, wherein the substrate is a (111)-textured transition metal.

5. The composition of matter according to claim 3, wherein the substrate is a bulk single crystal substrate or an ordered thin film on a secondary substrate, the bulk single crystal substrate or ordered thin film having in-plane lattice constant between about 3.0 Å and 2.2 Å.

6. The composition of matter according to claim 3, wherein the substrate is a metal interconnection or packaging level metal line on a complementary metal oxide semiconductor substrate.

7. The composition of matter according to claim 6, wherein the metal interconnection or packaging level metal line comprises grains of Ru, Pt, Ni, Nb, or Cu.

8. The composition of matter according to claim 3, wherein the substrate comprises Ru, Pd, Ni, Cu, Nb, Pt or $Al_2O_3$.

9. The composition of matter according to claim 3, wherein the substrate comprises silicon with a metal film provided between the silicon and said ordered film of BN.

* * * * *